United States Patent
Kanatake

(10) Patent No.: US 7,060,530 B2
(45) Date of Patent: Jun. 13, 2006

(54) SEMICONDUCTOR PACKAGE HAVING A RESIN CAP MEMBER

(75) Inventor: Mitsuhito Kanatake, Kanagawa (JP)

(73) Assignee: NEC Compound Semiconductor Devices, Ltd., Kawasaki (JP)

( * ) Notice: Subject to any disclaimer, the term of this patent is extended or adjusted under 35 U.S.C. 154(b) by 300 days.

(21) Appl. No.: 10/166,668

(22) Filed: Jun. 12, 2002

(65) Prior Publication Data

US 2002/0190266 A1 Dec. 19, 2002

(30) Foreign Application Priority Data

Jun. 13, 2001 (JP) .............................. 2001-178164

(51) Int. Cl.
H01L 21/44 (2006.01)
H01L 21/48 (2006.01)
H01L 21/50 (2006.01)

(52) U.S. Cl. ...................... 438/112; 257/788

(58) Field of Classification Search ................ 257/787, 257/789, 793, 112, 113, 114, 121, 124, 685, 257/704, 708, 709, 710, 723, 724, 725, 687, 257/700, 678, 734, 676, 680, 701, 702; 438/112, 438/113, 127, 110, 114, 121, 124
See application file for complete search history.

(56) References Cited

U.S. PATENT DOCUMENTS

| | | | | |
|---|---|---|---|---|
| 5,795,799 A * | 8/1998 | Hosoya | ....................... | 438/126 |
| 6,011,303 A * | 1/2000 | Tanaka et al. | .............. | 257/692 |
| 6,313,525 B1 * | 11/2001 | Sasano | ....................... | 257/704 |
| 6,432,737 B1 * | 8/2002 | Webster | ........................ | 438/53 |
| 6,518,501 B1 * | 2/2003 | Kawahara et al. | .......... | 174/52.4 |
| 2001/0045643 A1 * | 11/2001 | Katoh et al. | ................ | 257/706 |

FOREIGN PATENT DOCUMENTS

JP      2000-286354      10/2000

* cited by examiner

*Primary Examiner*—B. William Baumeister
*Assistant Examiner*—Dana Farahani
(74) *Attorney, Agent, or Firm*—McGinn IP Law Group, PLLC

(57) ABSTRACT

A semiconductor package has a base member made of a wiring board or a lead frame, a wall member fixed onto the base member to define a cavity, and a cured-resin cap member for encapsulating a semiconductor chip in the cavity. The curable-resin cap member is fixed onto the wall member by the curing process for the curable-resin cap member.

17 Claims, 10 Drawing Sheets

SEMICONDUCTOR PACKAGE HAVING A RESIN CAP MEMBER

BACKGROUND OF THE INVENTION (a) Field of the Invention

The present invention relates to a semiconductor package having a cap member and, more particularly, to a semiconductor package having a cap member for closing the opening of the semiconductor package to encapsulate a semiconductor chip in a cavity. The present invention also relates to a method for manufacturing such a semiconductor package.

(b) Description of the Related Art

A typical semiconductor package includes a wiring board or a lead frame having thereon wiring patterns and mounting thereon a semiconductor chip, which is encapsulated by a mold package on the wiring board or lead frame. In such a semiconductor package, epoxy resin having a higher dielectric constant increases the parasitic capacitance of the semiconductor chip to degrade the frequency characteristics thereof if the epoxy resin resides in close contact with the semiconductor chip. This may be avoided by an air cavity formed on the wiring board to receive therein the semiconductor chip, as described in JP-A-2000-286354, for example.

FIG. 1 shows the semiconductor package described in the above publication, wherein a wall member 32 having a top opening is fixed onto a wiring board 31 to form a package substrate defining a cavity 33, in which a semiconductor chip 37 is received. A planar cap member 35 is adhered onto the wall substrate 32 by an adhesive layer 42 at the top opening thereof for encapsulating the semiconductor chip 37 in a cavity 33. The bonding pads of the semiconductor chip 37 are connected through the bonding wires 39 and the wiring patterns of the wiring board 31 to the external terminals 40.

For fabrication of the semiconductor package shown in FIG. 1, a plurality of semiconductor packages arranged in a package array are first formed by bonding a cap substrate including a plurality of cap members 35 onto a wall substrate having a plurality of wall members 32, and then separated from one another at scribe lines by using a dicing blade.

FIG. 2 shows the package array in a top plan view thereof before bonding the cap substrate 35 onto the wall substrate 32. The semiconductor packages are substantially of a square and arranged in a two dimensional array, having a square hole 45 at each corner of the semiconductor package. The square hole 45 is used as a gas exhaustion hole from the cavity 33. Semiconductor packages are separated at the scribe lines 41 after bonding the cap substrate 35 onto the wall substrate 32 of the package substrate.

FIG. 3 shows the semiconductor packages in a sectional view thereof taken along line III—III in FIG. 2. A semiconductor chip 37 is received in the cavity 33 for which a gas exhaustion hole 45 is provided between adjacent cavities 33.

FIG. 4 shows the semiconductor packages shown in FIG. 3 in combination with the cap substrate 35, which encapsulates the plurality of semiconductor chips 37 within the respective cavities 33. For fabrication of the structure shown in FIG. 4, an adhesive layer 42 is formed on top of the wall substrate 32 before the cap substrate 35 is placed on the top of the wall substrate 32, followed by thermally curing the adhesive layer 42 to encapsulate the semiconductor chip 37 together with the air inside the cavities 33, and by dicing these substrates at the scribe lines 41.

The conventional process for fabricating the semiconductor packages as described above have the following problems. First, during heating the curable resin used as the adhesive layer 42, the air within the cavity 33 is expanded in volume to sometime flow toward outside the cavity 33 while raising the cap substrate 35. This involves a defect in adhesion between the cap substrate 35 and the wall substrate 32, thereby degrading the airtight of the cavity 33 and resistance of the semiconductor package against ingress of water.

Second, if the substrate 31, 32 or 35 has a deformation such as caused by warp, uniform adhesion is difficult to achieve. In such a case, a thrust pressure is often applied to the cap substrate 35 etc. This may cause a mechanical damage in the substrate 31, 32 or 35, thereby lowering the product yield of the semiconductor packages.

SUMMARY OF THE INVENTION

In view of the above problems in the conventional technique, it is an object of the present invention to provide a semiconductor package having improved airtight and higher resistance against the ingress of water, and is capable of encapsulating the semiconductor chip in the cavity with improved reliability even in the case of presence of a warp in the substrates.

It is also an object of the present invention to provide a method for fabricating such a semiconductor package.

The present invention provides a method for manufacturing a semiconductor package including the steps of: forming at least one curable resin layer: forming a package substrate having at least one cavity, the cavity having a top opening and receiving therein a semiconductor chip; placing the package substrate on the curable resin layer, with the top opening being closed by the curable resin layer; and curing the curable resin layer to form a cap member encapsulating the semiconductor chip in the cavity.

The present invention also provides a semiconductor package including a base member, a wall member fixed onto the base member to define a cavity, the cavity having a top opening and receiving therein a semiconductor chip, and a cured-resin cap member for closing the top opening to encapsulate the semiconductor chip in the cavity.

In accordance with the semiconductor package of the present invention and the semiconductor package manufactured by the method of the present invention, the cap member or cap substrate is adhered onto the wall member or wall substrate by curing the curable resin layer without using an adhesive, with the expansion of the air in the cavity being absorbed by the curable resin layer in the initial stage of the curing. This suppresses the possibility of the defect in the adhesion between the wall member (substrate) and the cap member (substrate).

The curable resin may be preferably a liquefied curable resin, which also functions as an adhesive after the curing thereof. The package substrate which may include a wall member and a base member may be made of ceramics or an organic material. The base member of the package substrate may be preferably a wiring board or a lead frame.

The above and other objects, features and advantages of the present invention will be more apparent from the following description, referring to the accompanying drawings.

PREFERRED EMBODIMENTS OF THE INVENTION

Figure 1:
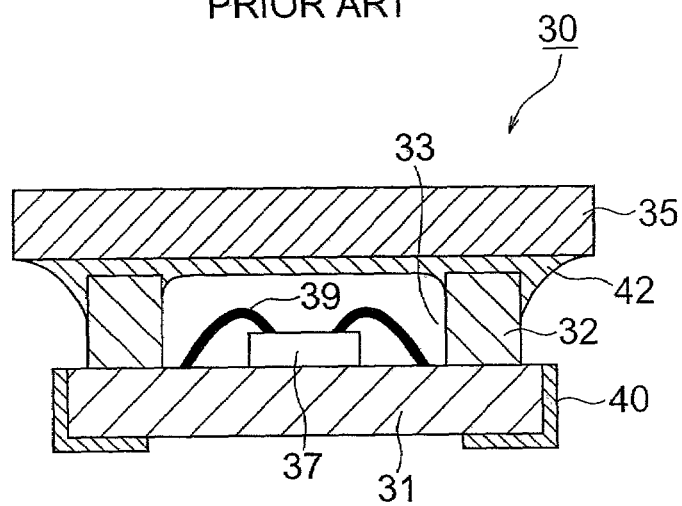
FIG. 1 is a sectional view of a conventional semiconductor package.
Figure 2:
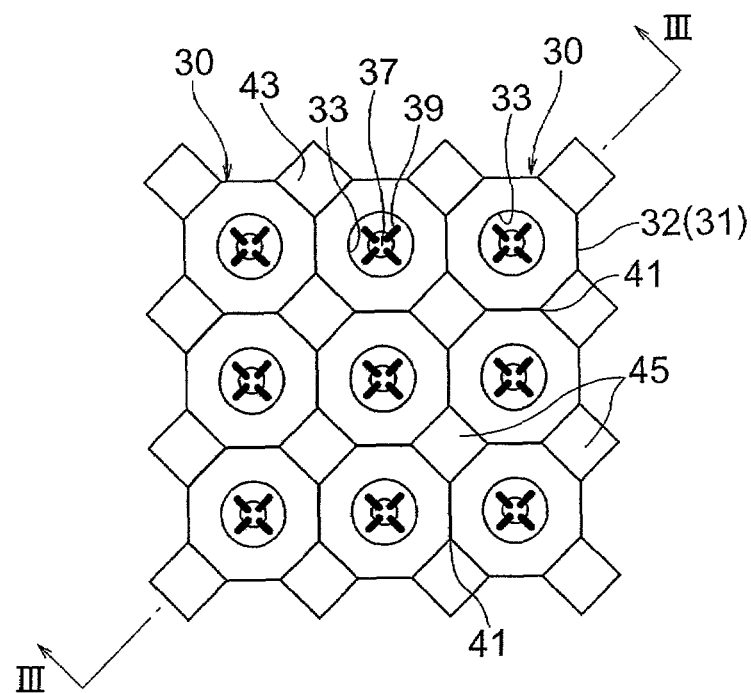
FIG. 2 is a top plan view of an array of semiconductor packages including the semiconductor package of FIG. 1 before the cap substrate is bonded onto the wall substrate.
Figure 3:
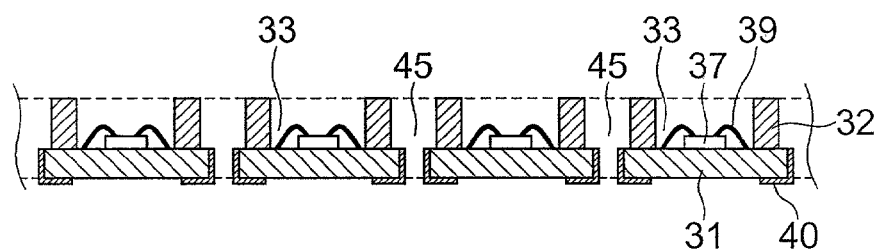
FIG. 3 is a sectional view of the semiconductor package array taken along line III—III in FIG. 2.
Figure 4:
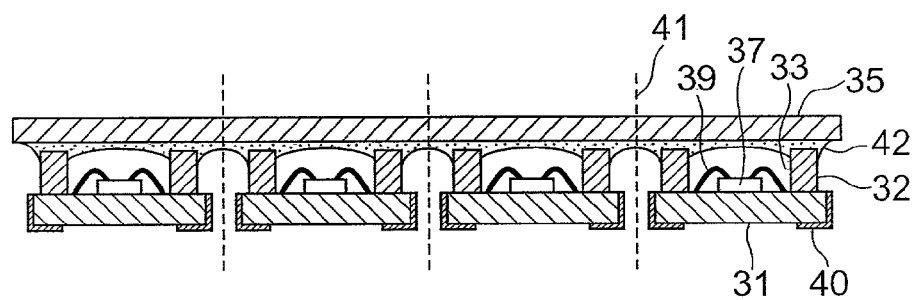
FIG. 4 is a sectional view of the semiconductor package array of FIG. 4, with the cap substrate being adhered onto top of the wall substrate.
Figure 5:
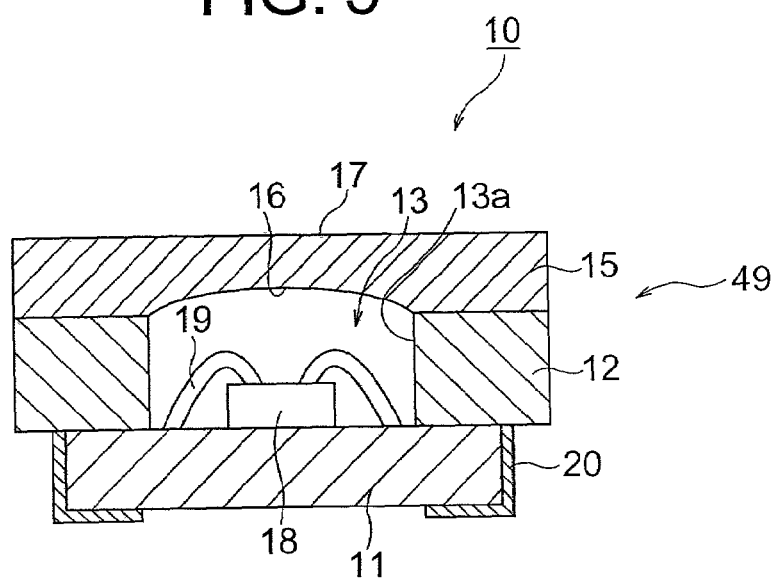
FIG. 5 is a sectional view of a semiconductor package according to a first embodiment of the present invention.

Referring to FIG. 5, a semiconductor package, generally designated by numeral 10, according to a first embodiment of the present invention includes a wiring board 11 mounting thereon a semiconductor chip 18, a wall member 12 stacked onto the wiring board 11 to form a package substrate 49 which defines therein a cavity 13 receiving therein a semiconductor chip 18, and a cap member 15 bonded onto the top of the wall member 12 for encapsulating the semiconductor chip 18 in the cavity 13. Each of the wiring board 11 and the wall member 12 may be made of ceramics or organic material.

The semiconductor chip 18 is located at the center of the cavity 13. The bonding pads of the semiconductor chip 18 are connected to the external terminals 20 through bonding wires 19 and the interconnects of the wiring board 11. The external terminals 20 are located at the bottom edge portion of the wiring board 11. The cap substrate 15 has a concave inner surface 16, which has a lower edge and a higher center, and a flat outer surface 17.

Figure 6:
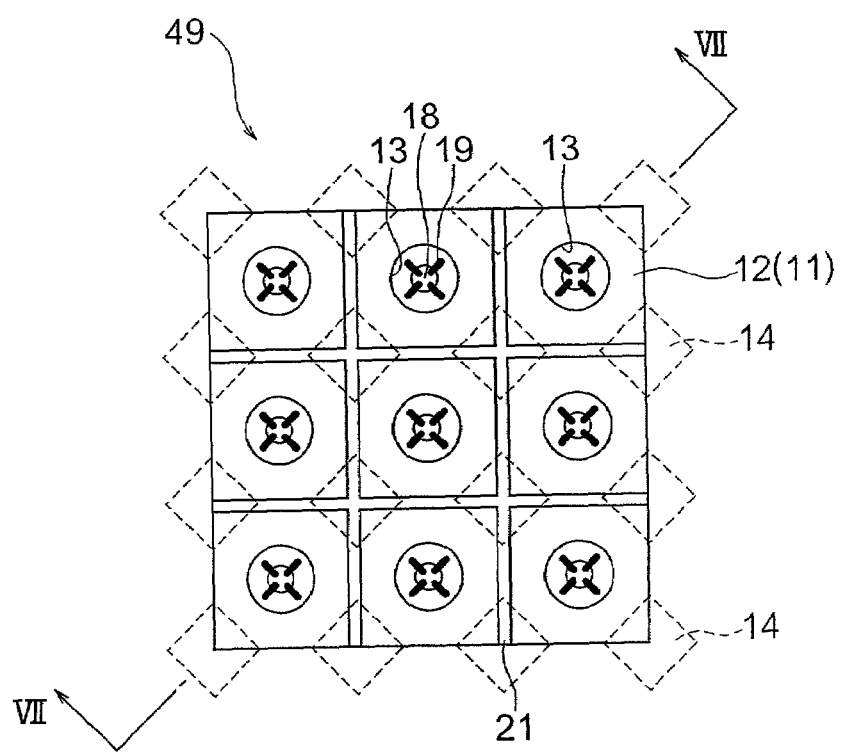
FIG. 6 is a top plan view of an array of semiconductor packages including the semiconductor package of FIG. 5 before the cap substrate is bonded onto the wall substrate.

Referring to FIG. 6, an array of semiconductor packages including the semiconductor package of FIG. 5 is a two-dimensional array, which is to be separated from one another at scribe lines 21 extending row and column directions of the array. A rectangular hole 14 is formed in the wiring board 11 at each intersection between the scribe lines 21, for receiving therein the external terminals 20. The external terminals 20 are connected to the bonding wires 19 through the interconnects formed on top of the wiring board 11, and connected to external wiring at the bottom surface of the wiring board 11.

Figure 7:
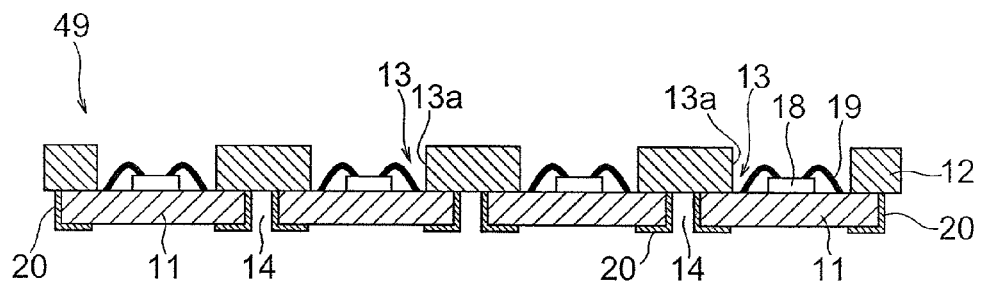
FIG. 7 is a sectional view of the semiconductor package array of FIG. 6 taken along line VII—VII in FIG. 6.

Referring to FIG. 7, the semiconductor package array includes a plurality of semiconductor chips 18 received in the respective cavities 13 separated from one another by the wall member 12 of the wall substrate. The external terminals 20 of each semiconductor package are located at the edge and inner wall of each hole 14 underlying the wall member 12 of the wall substrate.

Figure 8:
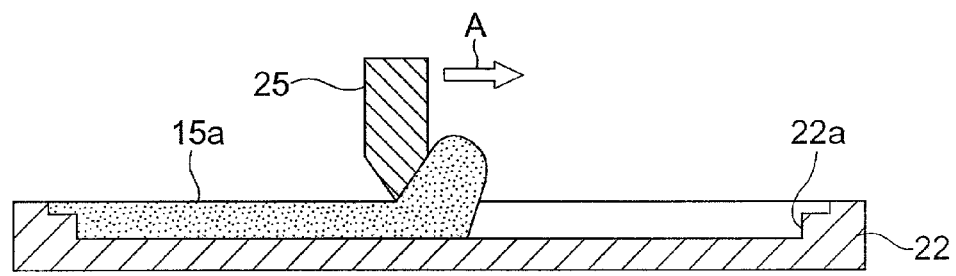
FIG. 8 is a sectional view of the semiconductor package array of FIG. 7 at a fabrication step thereof.

Referring to FIGS. 8 to 12, there are shown consecutive steps of a fabrication process for the semiconductor packages of the first embodiment. First, as shown in FIG. 8, a metallic mold die 22 having thereon a flat depression 22a is prepared, and curable resin 15a is poured into the flat depression 22a, followed by squeezing the top surface of the curable resin 15a for planarization thereof by using a squeezer 25 to form a curable resin layer 15a. The flat depression 22a has a depth of 0.3 to 0.6 mm, for example.

The curable resin 15a may be a thermosetting resin or an ultra-violet-ray curable resin, which may include an organic material such as epoxy-based resin, polyimide-based resin, or silicone-based resin. The thermosetting resin, if used, preferably has a curing temperature of 200 degrees C. or below, and more preferably between 120 and 150 degrees C. The viscosity of liquefied curable resin, if used, may preferably reside at 1000 Pa·s or above in terms of the indication by an E-type viscometer at a temperature of 29 degrees C. The E-type viscometer is one of the viscosity measuring instruments, which measures the viscosity as a resistance of the liquefied resin against a rotating turntable while allowing the turntable and a plate to sandwich therebetween the liquefied resin.

Figure 9:
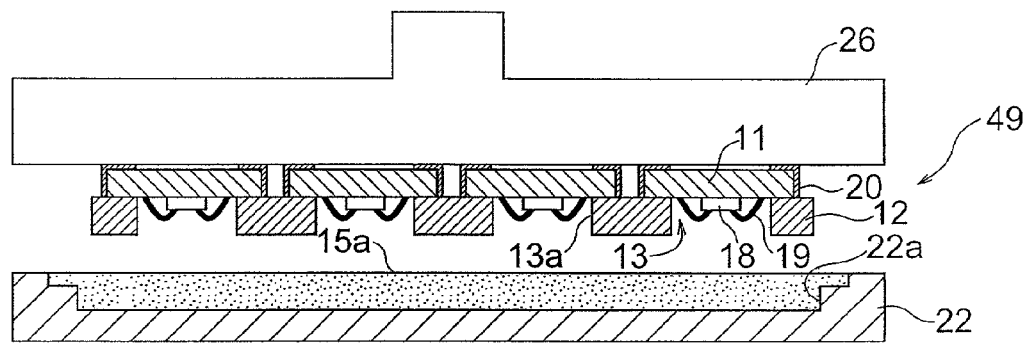
FIG. 9 is a sectional view of the semiconductor package array of FIG. 7 at a fabrication step thereof.
Figure 10:
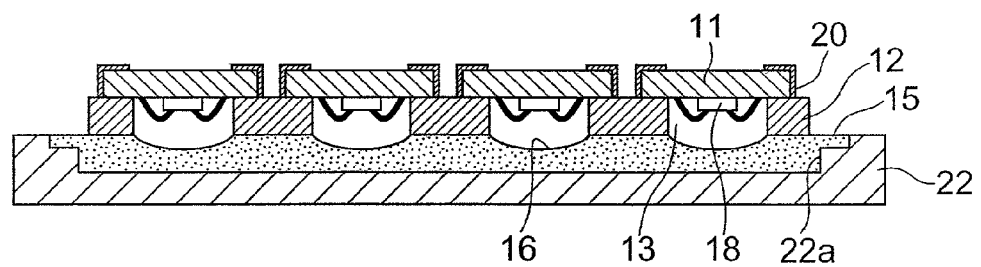
FIG. 10 is a sectional view of the semiconductor package array of FIG. 7 at a fabrication step thereof.

Subsequently, as shown in FIG. 9, an absorption collet 26 carrying at the bottom thereof the package substrate 49 receiving therein semiconductor chips 18 in the cavities 13 is located above the curable resin layer 15a, with the opening 13a of the cavities 13 being directed downward. The absorption collet 26 then moves downward to contact the bottom of the package substrate 49 and the top of the curable resin layer 15a, and presses the package substrate 49 with a moderate force toward the curable resin layer 15a so that the bottom of the wall substrate 12 sinks in the curable resin layer 15a by 100 to 150 μm from the top of the curable resin layer 15a. This allows each cavity 13 to contain air around the semiconductor chip 18 and be encapsulated by the curable resin 15a.

Thereafter, the curable resin layer 15a is heated from the bottom of the mold die 22 for two to three hours at a temperature of 200 degrees C. or below, preferably between 120 and 150 degrees C., for a thermosetting process. This provides the encapsulation structure shown in FIG. 10, without using an adhesive, wherein the curable resin layer 15a adhered onto the wall substrate 12 during the curing process absorbs a pressure rise due to the expansion of the air inside the cavity 13.

The curable resin layer 15a has a concave inner surface at each opening due to the pressure applied at the initial stage of the heating at which the curable resin layer 15a has a lower viscosity. In the encapsulation structure shown in FIG. 10, the top of the cured resin 15 adheres at the bottom of the wall substrate 12 during the curing step, whereby the cured resin 15 constitutes the cap member for each cavity 13. The bottom of the cured resin 15 has an excellent flat surface due to the flat depression 22a of the mold die 22.

Figure 11:
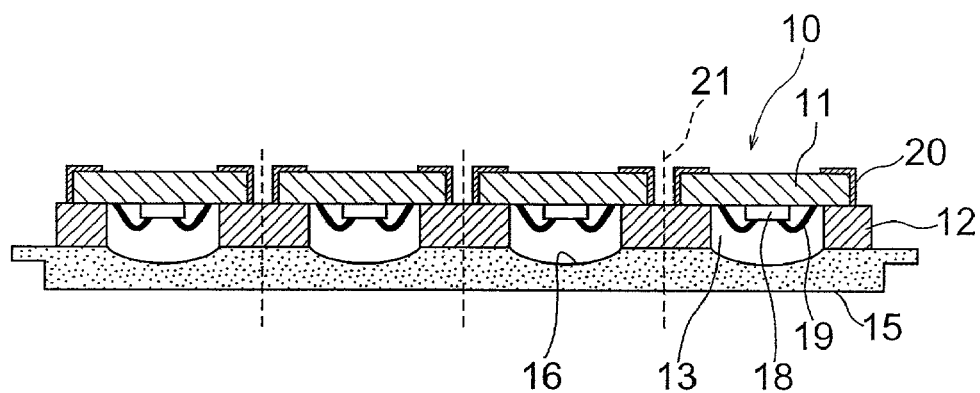
FIG. 11 is a sectional view of the semiconductor package array of FIG. 7 at a fabrication step thereof.

Subsequently, as shown in FIG. 11, the cured resin layer 15 together with the package substrate 49 including the wiring board 11 and the wall substrate 12 is peeled-off from the mold die 22. After the peel-off, the external surface of the cured resin layer, or cap substrate, 15 has an excellent flat surface, which adapts to specifications defining the semiconductor package.

Figure 12:
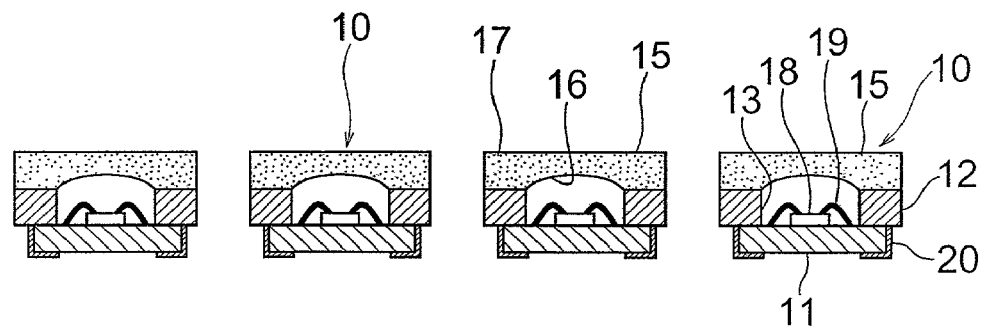
FIG. 12 is a sectional view of the semiconductor package array of FIG. 7 at a fabrication step thereof.

Thereafter, as shown in FIG. 12, the semiconductor packages are separated from one another at the scribe lines 21 by using a dicing blade. The cured resin layer or the cap member 15 encapsulates the semiconductor chip 18 in the cavity 13 of each semiconductor package.

The fabrication process as described above is suitably applied to fabrication of a semiconductor package having a square shape of 1.5 to 2.0 mm and including low noise GaAs FETs, for example. It may be also applied to fabrication of a 10×20 mm enlarged package, or a 3 to 6 mm square package including SAW filters, for example.

In the above process, the metallic mold die 22 may be replaced by a metallic flat panel on which a curable resin layer is formed by applying curable resin thereto while using a squeezing mask, which defines the external shape and size of the cap substrate 15.

Figure 13:
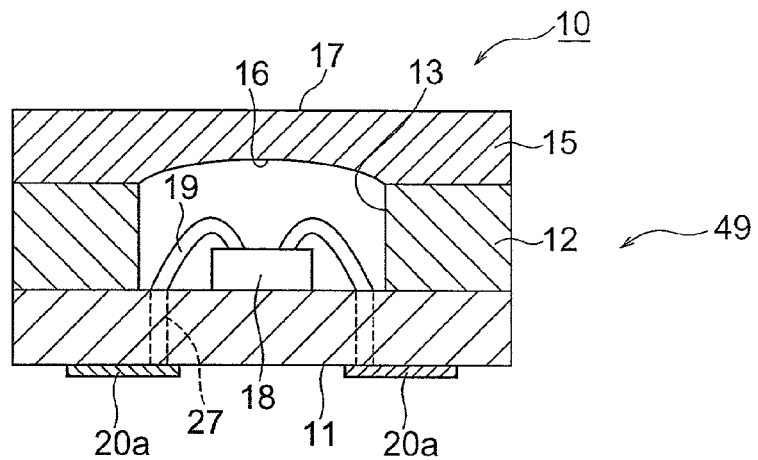
FIG. 13 is a sectional view of a semiconductor package according to a modified first embodiment.

Referring to FIG. 13, a modification of the semiconductor package of the first embodiment has a plurality of through-holes 27 formed in the wiring board 11. The external terminals 20a formed on the bottom surface of the wiring board 11 are connected to the bonding wires 19 via the through-holes 27. The modification of FIG. 13 simplifies the structure of the external terminals 20a due to the presence of the through-holes 27.

Figure 14:
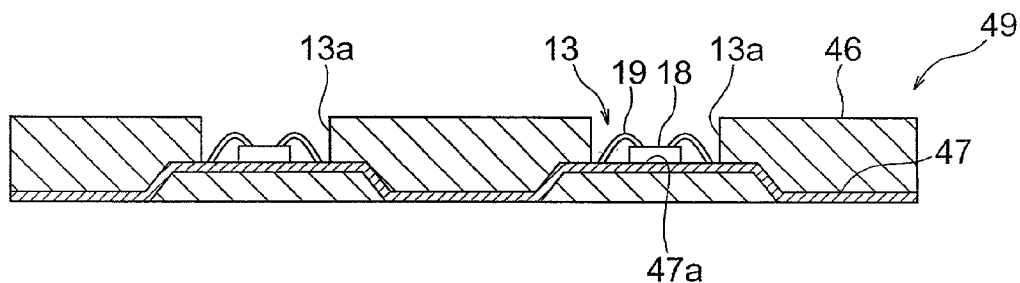
FIG. 14 is a sectional view of a semiconductor package according to a second embodiment of the present invention.

Referring to FIG. 14, a semiconductor package according to a second embodiment of the present invention includes a lead frame 47 instead of the wiring board 11 in the first embodiment. The lead frame 47 includes a plurality of wiring patterns and a plurality of die pads 47a on which respective semiconductor chips 18 are mounted. A resin package 46 encapsulates the lead frame 47 while exposing the bottom surface of the lead fame 47. The resin package 46 defines a plurality of cavities 13 each for receiving therein the die pad 47a on which the semiconductor chip 18 is mounted.

Figure 15:
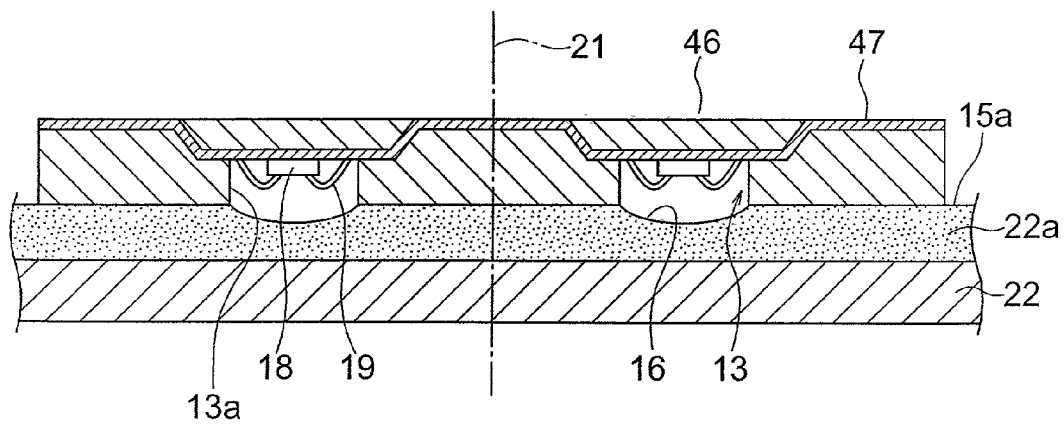
FIG. 15 is a sectional view of the semiconductor package of FIG. 14 in the state wherein the package substrate is in contact with curable resin.

Referring to FIG. 15, the resin package 46 receiving the semiconductor chips 18 in the respective cavities 13 are thrust onto the curable resin layer 15a, with the openings 13a of the resin packages 46 being directed downward. The curable resin layer 15a is then heated for curing to define a plurality of cavities 13, followed by removal of the mold die 22. After the thrust of the resin package 46, curing of the curable resin 15a and removal of the mold die 22, the resin package 46 is separated by a dicing blade at the scribe lines 21 to separate the semiconductor packages from one another.

Figure 16:
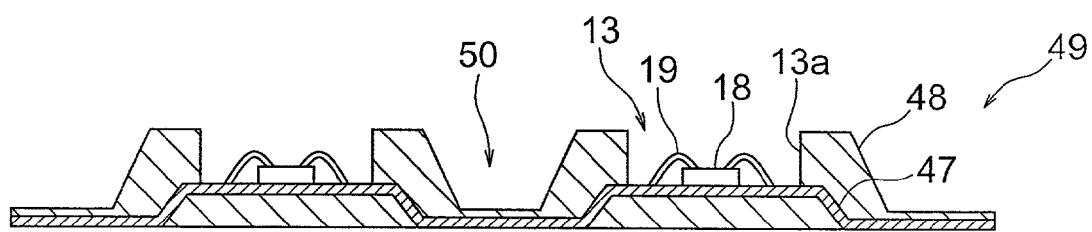
FIG. 16 is a sectional view of a semiconductor package array according to a third embodiment of the present invention.

Referring to FIG. 16, a semiconductor package according to a third embodiment of the present invention has a plurality of cavities 13, which are separated from one another by a wall member 48 of the wall substrate. Each wall member 48 of the wall substrate separating the adjacent cavities 13 from one another is formed with a groove 50, at the bottom of which a scribe line extends.

Figure 17:
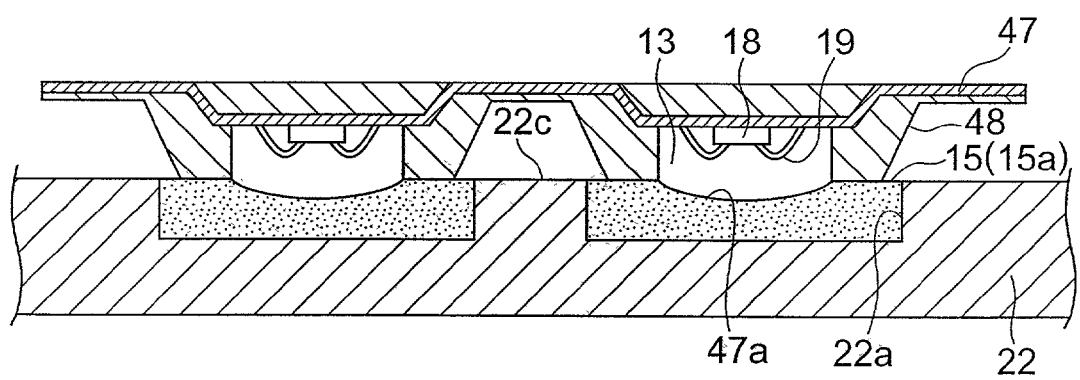
FIG. 17 is a sectional view of the semiconductor package array of FIG. 16 in combination with a mold die.

Referring to FIG. 17, the package substrate 49 is thrust onto the curable resin layer 15a received in respective depressions 22a of the mold die 22, with the openings 13a of the cavities 13 being directed downward. The cured resin layer 15 has a concave inner surface at the cavity 13 due to the inner pressure generated by the expansion of the air inside the cavity 13 during the curing step for the curable resin layer 15a.

Figure 18:
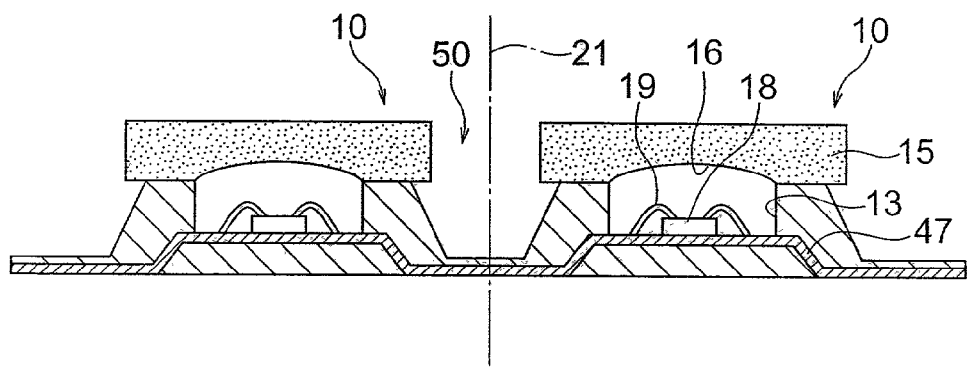
FIG. 18 is a sectional view of the semiconductor package array of FIG. 17 after removal of the mold die.

Referring to FIG. 18, the cured resin layer 15 is peeled-off together with the package substrate 49 from the mold die 22, and the resultant package array is placed upside down for preparing separation of the semiconductor packages at the scribe lines 21. The groove 50 of each wall member 48 reduces the time length for separating the semiconductor packages at the scribe lines 21 by using a dicing blade. Thus, the abrasion or wear amount of the dicing blade can be reduced along with reduction of the particles generated in the separation.

Figure 19:
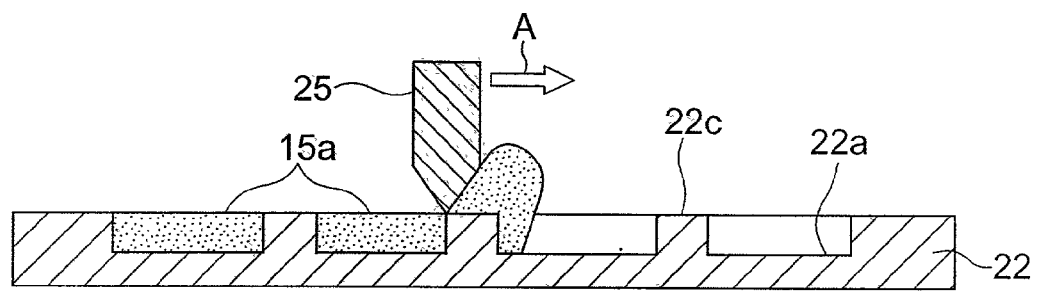
FIG. 19 is a sectional view of the mold die at the step of pouring curable resin into depressions of the mold die.
Figure 20:
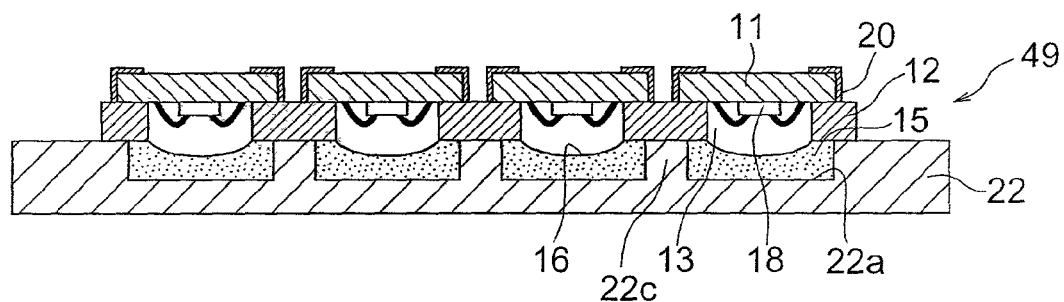
FIG. 20 is a sectional view of the semiconductor packages and mold die during the step of forming cap members.
Figure 21:
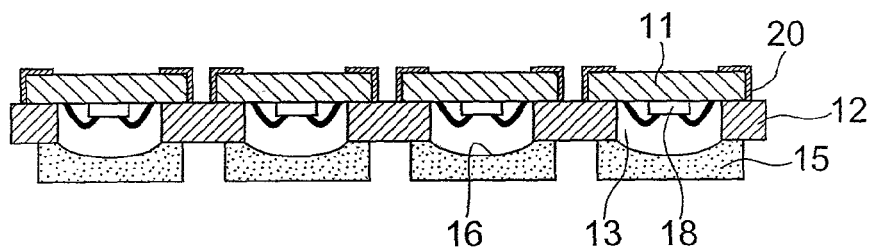
FIG. 21 is a sectional view of the semiconductor packages after removal of the mold die.

Referring to FIG. 19, during the step of pouring the curable resin 15a before the step of FIG. 17, the curable resin 15a is squeezed in each depression 22a by using a squeezer 25. After the curable resin 15a is squeezed, the package substrate 49 is bonded onto the curable resin layer 15a for encapsulating the semiconductor chips 18 in the cavities 13. This allows the cap member 15 for each semiconductor package is separated from the other cap members 15 at the beginning, as shown in FIG. 21. The separation of the cap members 15 allows the wear amount of the dicing blade to be further reduced together with reduction of the particles generated.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor package, comprising:
    forming a curable resin layer;
    forming a package substrate including a cavity therein, said cavity including a top opening and receiving therein a semiconductor chip;
    placing said package substrate onto said curable resin layer with said top opening being closed by said curable resin layer; and
    curing said curable resin layer to form a cap member encapsulating said semiconductor chip in said cavity.

2. The method according to claim 1, wherein said forming a curable resin layer includes using a squeezer.

3. The method according to claim 1, wherein said cavity comprises a plurality of cavities arranged in a matrix, each of said plurality of cavities receiving therein one of a plurality of semiconductor chips.

4. The method according to claim 3, wherein said forming a curable resin layer includes using a mold die with a flat depression.

5. The method according to claim 3, wherein said plurality of cavities is closed by said curable resin layer.

6. The method according to claim 3, wherein said curable resin layer comprises a plurality of curable resin layers, each of said plurality of curable resin layers corresponding to one of said plurality of cavities.

7. The method according to claim 6, wherein said plurality of curable resin layers are formed in a corresponding plurality of depressions in said mold die.

8. The method according to claim 1, wherein said package substrate includes a wiring board and a wall substrate mounted on said wiring board to form said cavity.

9. The method according to claim 1, wherein said package substrate includes a lead frame array including a plurality of die pads, and a curable resin layer including a plurality of depressions, each of said plurality of depressions receiving therein one of said plurality of die pads.

10. The method according to claim 1, wherein said curable resin layer comprises a thermosetting resin layer.

11. The method according to claim 10, wherein said curing allows said cap member to comprise a concave inner surface.

12. The method according to claim 3, wherein between adjacent cavities of said plurality of cavities is formed a wall member including a groove extending along a scribe line.

13. A semiconductor package, comprising:
a base member;
a wall member fixed onto said base member, thereby forming a cavity, said cavity including a top opening and receiving therein a semiconductor chip; and
a cured-resin cap member which is bonded onto a top of said wall member and which is disposed on said top opening for encapsulating said semiconductor chip in said cavity, said cavity containing air around said semiconductor chip,
wherein said cavity comprises a plurality of cavities arranged in a matrix and each of said plurality of cavities receives therein one of a plurality of semiconductor chips, and
wherein said base member includes a lead frame array including a plurality of lead frames and a plurality of depressions, each of said plurality of depressions receiving therein one of a plurality of die pads.

14. A method for manufacturing a semiconductor package, comprising:
forming a curable resin layer;
forming a package substrate including a cavity;
placing said package substrate onto said curable resin layer, said curable resin layer capping said cavity; and
curing said curable resin layer to form a cap.

15. A semiconductor package, comprising:
a base member;
a wall member fixed onto said base member, thereby forming a cavity, said cavity including a top opening and receiving therein a semiconductor chip; and
a cured-resin cap member, which includes a concave inner surface, for closing said top opening to encapsulate said semiconductor chip in said cavity,
wherein said cured-resin cap member includes a concave inner surface,
wherein said cavity includes air around said semiconductor chip.

16. The semiconductor package according to claim 15, wherein said base member and said wall member comprise a curable resin.

17. The semiconductor package according to claim 14, wherein said cavity includes air around a semiconductor chip, which is encapsulated by said curable resin.

* * * * *